United States Patent [19]
Greywall

[11] Patent Number: 5,963,857
[45] Date of Patent: Oct. 5, 1999

[54] ARTICLE COMPRISING A MICRO-MACHINED FILTER

[75] Inventor: Dennis S. Greywall, Whitehouse Station, N.J.

[73] Assignee: Lucent Technologies, Inc., Murray Hill, N.J.

[21] Appl. No.: 09/009,599

[22] Filed: Jan. 20, 1998

[51] Int. Cl.$^6$ ........................................ H04B 1/10
[52] U.S. Cl. .................. 455/307; 455/339; 455/313; 455/338
[58] Field of Search ..................... 455/307, 339, 455/313, 338; 333/186, 187, 188, 197, 198, 199, 200; 310/309, 320, 25

[56] References Cited

U.S. PATENT DOCUMENTS

| | | | |
|---|---|---|---|
| 4,853,660 | 8/1989 | Schloemann | 333/204 |
| 4,926,143 | 5/1990 | Harada et al. | 310/25 X |
| 5,222,255 | 6/1993 | Kuo et al. | 455/307 X |
| 5,361,053 | 11/1994 | Hosokawa et al. | 310/25 X |
| 5,455,547 | 10/1995 | Lin et al. | 333/186 |
| 5,491,604 | 2/1996 | Nguyen et al. | 333/197 X |
| 5,793,268 | 4/1997 | Attaiyan | 333/219.2 |

*Primary Examiner*—Wellington Chin
*Assistant Examiner*—Yemane Woldetatios

[57] ABSTRACT

An article comprising a micro-machined filter advantageously comprises a micro-machined resonator, a drive circuit and a detection circuit, at least a portion of which are circuits are disposed on the resonator within a magnetic field. In operation, an input signal is delivered to the drive circuit. The resonator is excited to movement by the Lorentz force that is generated as signal current varies. Due to the resonator's movement, a voltage is induced in the detection circuit, which moves with the resonator. Using well-known micro-machining techniques, a resonator can be made that has mechanical resonance frequencies extending into the GHz regime. Under proper conditions, such resonances advantageously exhibit very high Q-values, so that the resonator shows a significant physical response (e.g., movement) over a very narrow range of excitation frequency. When the frequency of the input signal matches such a frequency (i.e., the resonant frequency), the device generates a voltage having such a frequency.

20 Claims, 6 Drawing Sheets

FIG. 5
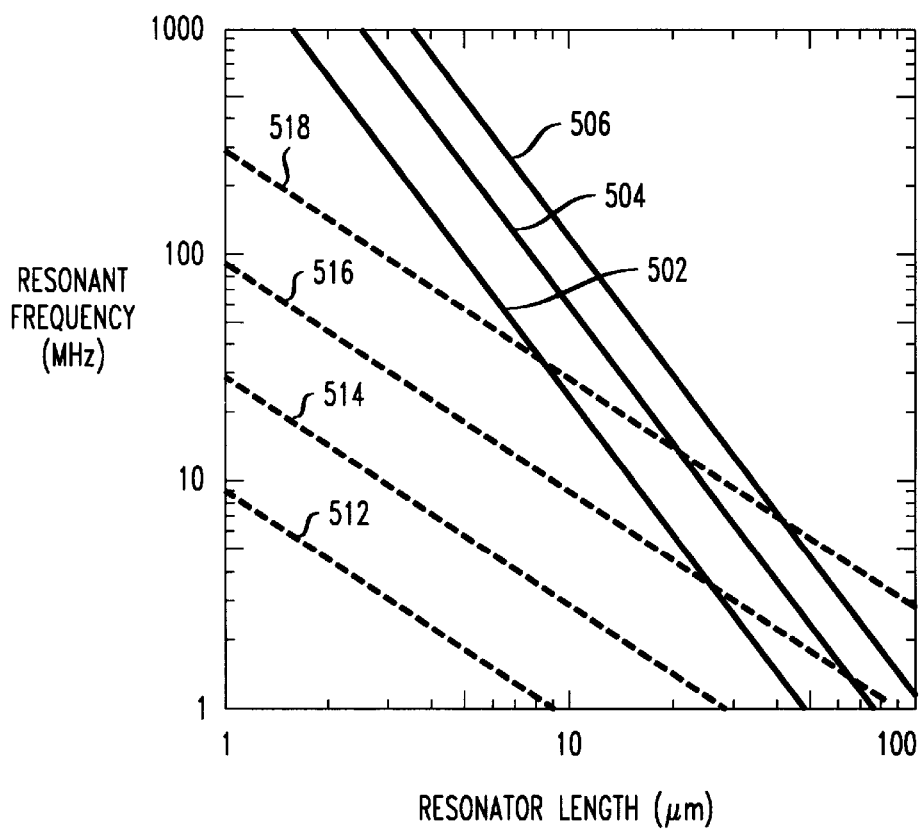
FIG. 6A
FIG. 6B
FIG. 6C

ARTICLE COMPRISING A MICRO-MACHINED FILTER

FIELD OF THE INVENTION

The present invention relates to frequency discrimination. More particularly, the present invention relates to a micro-machined device operable to receive a broadband signal and to deliver, at its output, a narrowband signal comprising only those frequencies within a predetermined band.

BACKGROUND OF THE INVENTION

A filter is a frequency-discriminating device, circuit or network designed to select or pass certain bands of frequencies with low attenuation and to highly attenuate other frequencies. Filters are ubiquitous; they are used in many different types of electrical systems. One important type of system in which filters are used extensively is telecommunications systems. Filters will be found in virtually all elements of telecommunications systems, including, for example, radios, amplifiers and wireless and wireline terminals (e.g., telephones, videophones, facsimile transmission devices) to select certain frequencies in preference to others.

Filters may be categorized according to their characteristic operation (e.g., low-pass, high-pass, band-pass). A band-pass filter, for example, passes a band or bands of frequencies and attenuates all frequencies outside of the "pass" regions. An important property of a filter is its "selectivity." As an illustrative example of that property, consider a radio tuned to the frequency of a particular transmitting station, say 102.7 MHz. While signals from other broadcasting stations having other frequencies (e.g., 101.5 MHz, 104.3 MHz, etc.) are present at the radio's antenna at nominally equal strength to the 102.7 MHz signal, such other signals produce little or no signal strength in the radio.

The frequency (102.7 MHz in the above example) generating a maximum response (e.g., current) in the filter is referred to as the "resonant" frequency. A filter is not infinitely selective; there will be a range of frequencies centered about the "resonant" frequency that are only moderately attenuated. The term "bandwidth" is used to refer to that range of moderately-attenuated frequencies. The selectivity of a filter is typically expressed as a ratio of resonant frequency to the bandwidth. That ratio is referred to as the "quality factor" (Q) of the filter. The greater the magnitude of Q, the greater the selectivity of the filter.

There are several limitations or drawbacks to using conventional band-pass filters comprised of resistors, inductors and capacitors. One drawback is that the quality factor of such conventional band-pass filters is typically limited to a maximum value on the order of $10^2$. In many applications, a band-pass filter having a significantly higher Q would be desirable. Another drawback pertains to the limited extent to which such filters can be miniaturized. Currently, such filters have dimensions on the order of inches (e.g., 1"×½"). The size limitation arises due to the phyical geometry of the elements comprising such a filter. Specifically, the relevant properties of inductors and capacitors (i.e., inductance and resistance) is related to their physical size.

It would be desirable to reduce the size of such filters so that associated electronics (e.g., a radio) could be further miniaturized.

SUMMARY OF THE INVENTION

In accordance with an illustrative embodiment of the present invention, a radio advantageously includes a micro-machined band-pass filter. The micro-machined filter advantageously comprises a micro-machined resonator, a drive circuit and a detection circuit disposed within a magnetic field. In some embodiments, the drive and detection circuits are each realized as respective first and second conductors or wire traces that are in mechanical communication with the resonator.

In operation, an input signal is delivered to the drive circuit. The resonator is excited to movement by the Lorentz force that is generated as signal current varies. Due to the resonator's movement, a voltage is induced in the second conductor, which moves with the resonator.

Using well-known micromachining techniques, a resonator can be made that has mechanical resonance frequencies extending into the GHz regime. Under proper conditions, such resonances advantageously exhibit very high Q-values, so that the resonator shows a significant physical response (e.g., movement) over a very narrow range of excitation frequency. When the frequency of the input signal matches such a frequency (i.e., the resonant frequency), the device generates a voltage.

BRIEF DESCRIPTION OF THE DRAWINGS

FIG. 5 is a log-log plot depicting the fundamental resonant frequency of the filter of FIG. 4 plotted as a function of resonator length;

FIGS. 6a–6c depict the shape of the first, second and third resonant modes of the filter of FIG. 4;

DETAILED DESCRIPTION

Figure 1:
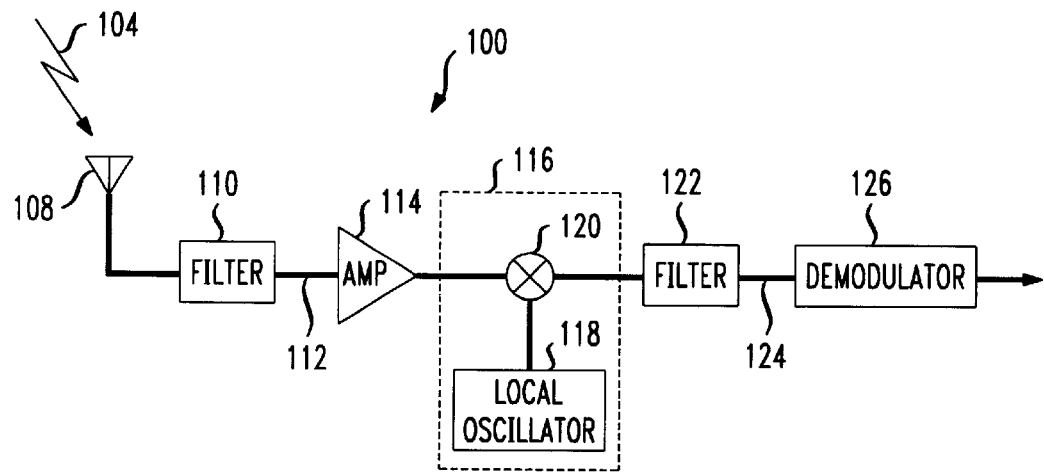
FIG. 1 depicts a conventional radio.

FIG. 1 depicts a simplified partial schematic of a conventional radio 100. Signal 104, comprising a plurality of modulated RF carrier signals having different frequencies within a first frequency band, is received by antenna 108. In addition to receiving signal 104, the antenna receives a plurality of undesired signals covering an extremely wide range of frequencies outside the first frequency band. Signal 104 and the undesired signals are routed to band-pass filter 110, which delivers an output signal 112 comprising substantially only those signals having frequencies within the first frequency band.

Signal 112 is amplified in low-noise amplifier 114 and fed to downconverter 116. The downconverter comprises tunable local oscillator 118 and mixer 120. Downconverter 116 is operable to "down convert" amplified signal 112 so that a desired one of the modulated RF carrier signals comprising the amplified signal 112 is within the pass band of filter 122. Filter 122 delivers signal 124, which comprises substantially only the one modulated RF carrier signal. Signal 124 is then demodulated in demodulator 126.

Conventional radio 100 is advantageously realized as an integrated circuit (IC) contained on a semiconductor chip, with the exception of conventional band-pass filters 110 and 122. Due to their size and structure, such conventional filters are not amenable to integration on an IC. Thus, signals to be filtered in those filters must be disadvantageously routed off-chip for filtering, and the output of the filters must be routed back to the chip for futher processing.

A radio in accordance with an illustrative of the present invention, has the same layout as shown in FIG. 1, but the conventional band-pass filters are replaced by micro-machined filters described herein. Such a micro-machined filter is advantageously substantially smaller and less expensive than a conventional filter, and has a "quality factor" Q that is typically orders of magnitude greater than the Q of a conventional filters. As is known to those skilled in the art, the quality factor may be expressed as the ratio of the resonant frequency of the resonator to its bandwidth. In the present context, the quality factor may be viewed to be a measure of the "selectivity" of the filter. In some embodiments, due to their small size, the present micro-machined filters are advantageously incorporated directly into the IC layout that comprises the radio.

Figure 2:
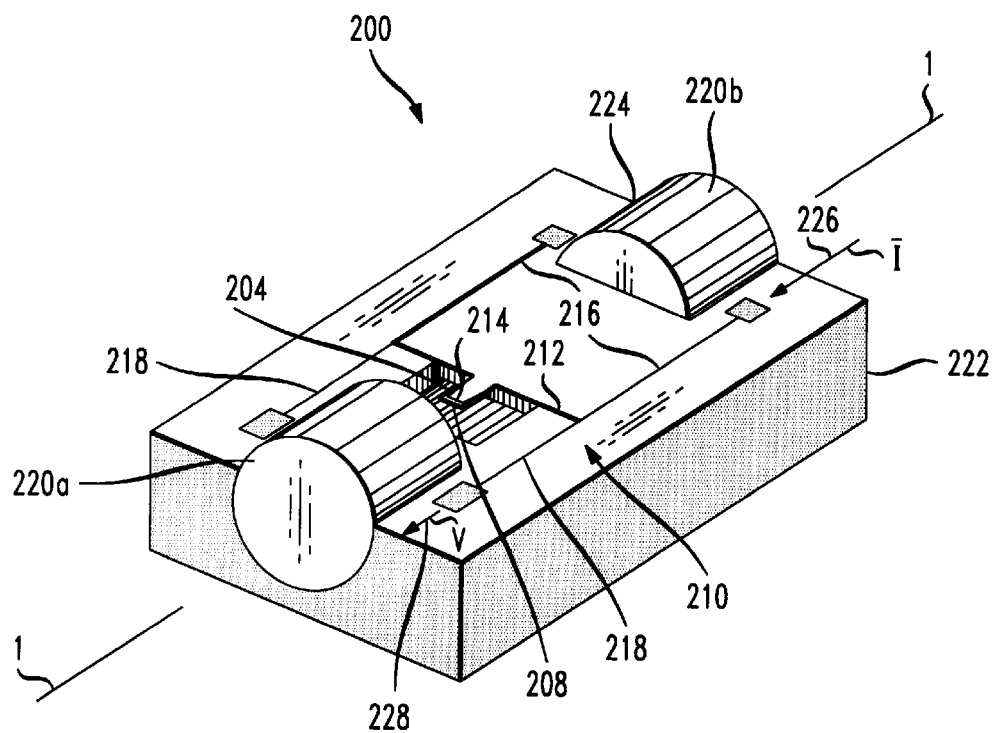
FIG. 2 depicts a micro-machined filter in accordance with a first illustrative embodiment.

FIG. 2 depicts illustrative band-pass filter 200 suitable for use in an improved radio in accordance with the present invention. Filter 200 advantageously includes resonator 204, drive/detection circuit 210, and magnets 220a, 220b. In the illustrated embodiment, filter 200 is formed on support 222, having v-grooves 224 for receiving the magnets.

In the illustrative embodiment depicted in FIG. 2, the drive/detection circuit 210 is disposed on support 222 and configured in the shape of the letter "H." First portion 216 of drive/detection circuit 210 receives input signal 226 and second portion 218 delivers output signal 228. In the illustrative embodiment, third portion 212 of drive/detection circuit 210 is advantageously disposed in orthogonal relation to axis 1—1 (except for a minor part thereof disposed along the long edges of resonator 204). Segment 214 of third portion 212 of the drive/detection circuit is disposed at end 208 of resonator 204. In the illustrative embodiment, resonator 204 is configured as a cantilever.

In operation, input signal 226 is delivered to first portion 216 of drive/detection circuit 210. Input signal 226, having current I, is carried along a "drive" portion of the drive/detection circuit, which drive portion comprises first 216 and third 212 portions of the drive/detection circuit. Due to the presence of input signal 226 in a magnetic field (generated by magnets 220a, 220b) having field lines running parallel to axis 1—1, a force (i.e., the Lorentz force) is generated. The force is directed orthogonally to the surface of, and at end 208 of, resonator 204. When the frequency of input signal 226 is about equal to the resonant frequency of resonator 204, the force causes the resonator to resonate at its resonant frequency.

A voltage V is induced in a "detection" portion of the drive/detection circuit, which detection portion comprises second 218 and third 212 portions of the drive/detection circuit. The induced voltage results from the motion of segment 214 of drive/detection circuit 210 in the magnetic field. Thus, filter 200 generates output signal 228 in response to the presence of input signal 226 having the appropriate frequency (i.e., the resonant frequency). Note that a filter in accordance with illustrative embodiments of the present invention are "active" devices. That is, rather than "passing" a signal having a desired frequency, the present filter generates a signal (i.e., output signal 228) when an input signal having the desired frequency is "detected."

Support 222 may suitably be comprised of silicon or other conveniently-available materials. The resonator 204 can be formed from material that is suitable for micro-machining and that possesses properties appropriate for building a resonator having a desired resonant frequency. In some embodiments, the resonator is comprised of silicon nitride. Design guidelines for building resonators having a predetermined resonant frequency are provided later in this specification.

Figure 3:
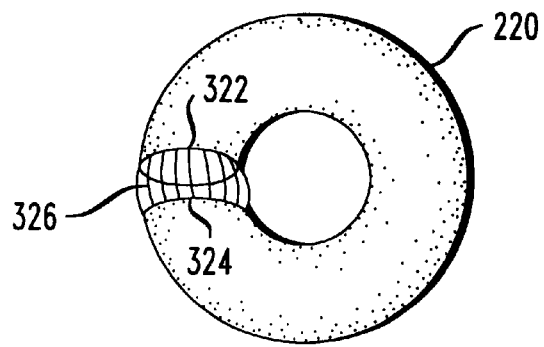
FIG. 3 depicts the magnetic field generated by a magnet within a filter in accordance with an illustrative embodiment of the present invention.

In some embodiments, only a single magnet is used. In such embodiments, a length of wire having magnetic properties is advantageously formed into a substantially circular shape. There is a small gap in the circular shape wherein the resonator is located. If, as described in more detail later in this specification, the gap is significantly smaller than the diameter of the wire, then magnetic field lines 322 running between opposed edges 322, 324 of the wire are substantially confined to the region bounded by the surface of the wire, as depicted in FIG. 3. In other embodiments, such as depicted in FIG. 2, resonator 204 is located between two small bar magnets 220a, 220b. In such embodiments, the magnetic field is not well confined. If stray magnetic fields present a problem for associated equipment, filter 200 can be shielded, such as by placing it in a box comprised of a material having a high magnetic permeability such as, for example, iron or $\mu$-metal.

The magnet may be formed of any suitably-magnetic material, including, without limitation, iron or iron/cobalt. Moreover, in some embodiments, such as those in which filter 200 comprises a single magnet having a substantially circular configuration (FIG. 3), the magnet can have a "hybrid" composition. In those embodiments, a portion of the magnet, such as, for example, the "straight" section near resonator 204 (FIG. 2), is formed of iron or other conventional magnetic material, and the balance of the wire is comprised of one or more "exotic" magnetic materials. Such exotic magnetic materials include, without limitation, rare-earth magnetic materials (e.g., neodymium iron boride $Nd_2Fe_{14}B$, Sumarium Cobalt $Sm_2Co_{17}$). Exotic magnetic materials tend to retain their magnetic properties better than iron.

In still other embodiments, magnetic material is advantageously deposited, using well-known techniques (e.g., sputtering, etc.), on support 222 to form a magnet in a desired configuration. From a manufacturing standpoint, such "deposited" magnets may have advantages over using preformed wire. In particular, if the magnet is sputtered, etc., then the complete filter can be advantageously formed on a support and integrated with other circuits, such as those of a radio. To do so, a layer of material such as silicon nitride or polysilicon, for example, is first deposited on a support, such as silicon. A resonator is then patterned (typically photolithographically) in the layer, and "released" (e.g., such as by removing a portion of the support underneath the resonator using an etchant) so that it is free to move when actuated. Wire traces for the drive and the detection circuits are deposited on the resonator and the support, and magnetic or magnetizable material is sputtered or otherwise deposited such that the magnetic field of the magnet, in some embodiments, is advantageously orthogonal to at least part of the drive circuit and the detection circuit disposed on the resonator.

In additional embodiments, an electromagnet, rather than the aforedescribed permanent magnets, is used for generating the magnetic field. Such an electromagnet can be realized by wrapping a coil around a portion of wire, and applying a current to the coil.

The structure and operation of filter 200 in accordance with a first illustrative embodiment of the present invention was described above. Equations and guidelines presented below provide those skilled in the art with a method for designing such a filter to operate at a particular resonant frequency. Illustrative examples of filters in accordance with the first illustrative embodiment having various resonant frequencies, and design parameters for such filters, are presented below.

The resonant frequency f the various modes of resonator 204 is determined by:

$$f = \frac{\eta_n^2}{4 \cdot (3)^{1/2} \pi} \cdot \frac{t_c}{l_c^2} \cdot (E/\rho)^{1/2} \quad [1]$$

where:

$\eta_n$ is a numerical coefficient associated with the nth vibrational mode. For the present configuration: $\eta_1 = 1.875$; $\eta_2 = 4.694$; and $\eta_3 = 7.855$.

E is Young's modulus;

$\rho$ is the density of the resonator;

$t_c$ is the thickness of the resonator;

$l_c$ is the length of the resonator.

The deflection $u_{end}$ of end 208 of resonator 204 due to force F applied orthogonally to its surface at end 208 is given by:

$$u_{end} = \frac{4F}{Ew_c} \cdot (l_c/t_c)^3 \quad [2]$$

where: $w_c$ is the width of the resonator.

For the illustrative drive scheme of FIG. 2, force F, which is the Lorentz force, is given by:

$$\vec{F} = I \oint \vec{dl} \cdot \vec{B} \quad [3]$$

where:

I is the current of input signal 226;

dl is segment 214 of the drive/detection circuit disposed at end 208 of the resonator;

B is the magnetic field.

For the illustrative filter 200 shown in FIG. 2, expression [3] simplifies to:

$$F = IBw_c \quad [4]$$

When the frequency of input signal 226 is equal to one of the n resonant frequencies of the resonator, the response of the resonator, given by expression [2], will be a factor of Q (the quality factor) larger. The magnitude of the allowable displacement of end 208 of the resonator is proportional to resonator length $l_c$. As such, it is useful to define the relative displacement $\alpha_c$ of resonator 204: $\alpha_c = u_{end}/l_c$ Substituting expression [4] into expression [2], multiplying by Q, rear ranging and introducing $\alpha_c$ gives the current I necessary to generate a given relative displacement at resonance:

$$I = \frac{\alpha_c E}{4QB} \cdot \frac{t_c^3}{l_c^2} \quad [5]$$

The voltage V induced in the drive/detection circuit due to the movement of circuit segment 214 is given by:

$$V = \oint (\vec{v} \times \vec{B}) \cdot \vec{dl} \quad [6]$$

where: v is the velocity of dl (i.e., segment 214 of the drive/detection circuit disposed at end 208 of the resonator).

For illustrative filter 200, expression [6] simplifies to:

$$V = 2\pi \alpha_c w_c l_c f B \quad [7]$$

The foregoing expressions will allow a skilled practioner to make a filter incorporating resonator 204 and having characteristics desired for a particular application. Such expressions are applied below in several illustrative examples. For the following examples, it is assumed that resonator 204 is comprised of silicon nitride; resonator length $l_c$ and width $w_c$ are equal; resonator thickness $t_c$ equals 0.5 microns; relative displacement $\alpha_c$ equals 0.01; magnetic field strength B equals 2 tesla; and the quality factor Q equals $10^5$.

Those skilled in the art will recognize that the aforementioned Q value is about about 3 orders of magnitude greater than the Q values exhibited by conventional R-L-C bandpass filters. Such a high quality factor Q is possible because mechanical losses are very low. To the extent such losses are present, they are primarily due to gas-damping effects. In some embodiments, surrounding walls are kept far from the resonator to keep losses low, thereby resulting in a high quality factor. In other embodiments, gas pressure is kept low, such as under partial vacuum, to keep losses low, again resulting in a high quality factor. In still other embodiments, surrounding walls are kept far from the resonator and gas pressure is maintained under partial vacuum.

Substituting the values provided above into expressions [1], [5] and [7] yields:

$$f = 510 \eta_n^2 t_c / l_c^2 \quad [8]$$

$$V = 0.126 l_c^2 f \quad [9]$$

$$I = 4.8 \times 10^3 t_c^3 / l_c^2 \quad [10]$$

Expressions [8]–[10] are not "general" expressions; the value of the constant is based on the forgoing assumptions and further based on the measurement units (i.e., length in $\mu$m, frequency in MHz, voltage in $\mu$V and current in $\mu$A).

Expressions [8]–[10] are used to generate design parameters for illustrative examples of filter 200, where lenght $l_c$ of resonator 204 is varied from 1 to 20 microns. Such parameters are tabulated in TABLE I below.

TABLE I

| $l_c$ <$\mu$m> | $f_1$ <MHz> | $f_2$ <MHz> | $f_3$ <MHz> | $V_1$ <$\mu$V> | $V_2$ <$\mu$V> | $V_3$ <$\mu$V> | I <$\mu$A> |
|---|---|---|---|---|---|---|---|
| 1 | 900 | 5600 | 16000 | 113 | 700 | 2000 | 600 |
| 2 | 225 | 1400 | 4000 | 113 | 700 | 2000 | 150 |
| 3 | 100 | 624 | 1748 | 113 | 700 | 2000 | 67 |

TABLE I-continued

| $l_c$ <µm> | $f_1$ <MHz> | $f_2$ <MHz> | $f_3$ <MHz> | $V_1$ <µV> | $V_2$ <µV> | $V_3$ <µV> | I <µA> |
|---|---|---|---|---|---|---|---|
| 4 | 56 | 351 | 983 | 113 | 700 | 2000 | 38 |
| 5 | 36 | 224 | 640 | 113 | 700 | 2000 | 24 |
| 10 | 9 | 56 | 160 | 113 | 700 | 2000 | 6 |
| 20 | 2 | 14 | 40 | 113 | 700 | 2000 | 2 |

Figure 4:
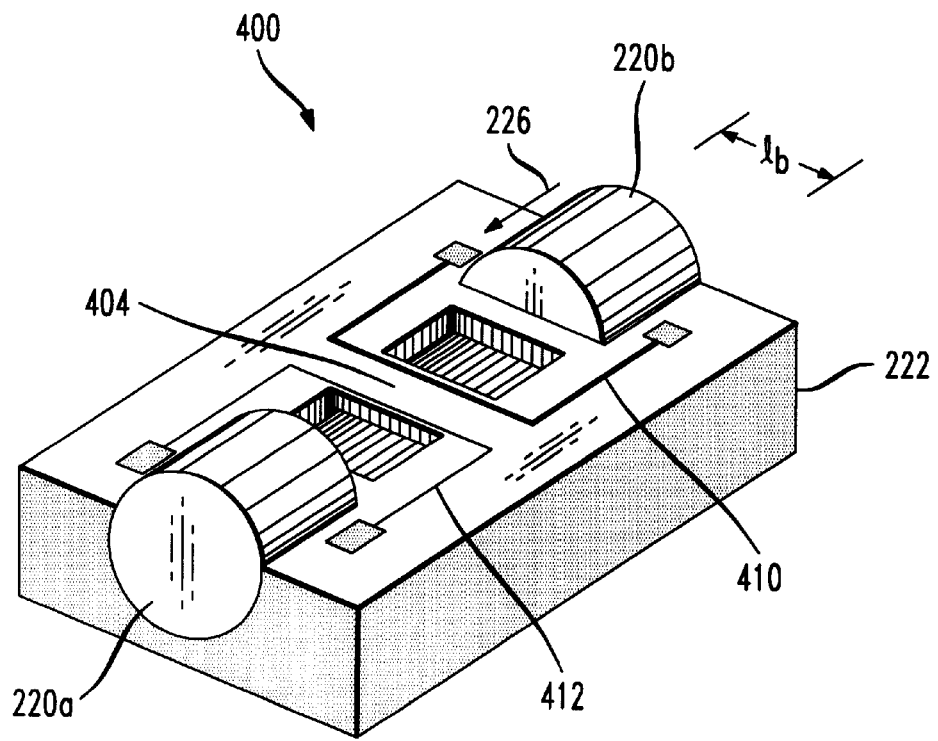
FIG. 4 depicts a micro-machined filter in accordance with a second illustrative embodiment.

FIG. 4 depicts filter 400 in accordance with a second illustrative embodiment of the present invention. In filter 400, resonator 404 is a uniform beam having length $l_b$ fixed at both ends to support 222. Length $l_b$ of resonator 404 is oriented in orthogonal relation to the magnetic field generated by magnets 220a,b. Filter 400 includes seperate drive 410 and detection 412 circuits. The filter 400 functions in the same manner as filter 200, wherein the Lorentz force generated by the presence of input signal 226 in a magnetic field causes resonator 404 to move. When the frequency in input signal 226 is about equal to the resonant frequency of resonator 404, the Lorentz force causes the resonator to resonate at its resonant frequency. A voltage is induced in detection circuit 412 as a result of the motion of the portion of the detection circuit disposed on resonator 404.

In embodiment wherein resonator 404 is not under tension, the resonant frequency f of the various modes of the resonator is given by:

$$f = \frac{\eta_n^2}{(3)^{1/2}\pi} \cdot \frac{t_b}{l_b^2} \cdot (E/\rho)^{1/2} \quad [11]$$

where:

$\eta_1 = 2.364$; $\eta_2 = 3.927$; $\eta_3 = 5.498$ (wherein the subscript indicates the vibrational mode number; and the subscript "b" (for beam) replaces the subscript "c" (for cantilever) used for the previous embodiment.

In embodiments wherein resonator 404 is under tension and the contribution to the beam's restoring force due to an intrinsic stress S is large compared to the bending moment term, resonance frequencies are given by:

$$f = \frac{1}{(2nl_b)} \cdot (S/\eta)^{1/2} \quad [12]$$

FIG. 5 depicts, on a log-log plot, the fundamental resonant frequency of a silicon nitride resonator 404, plotted as a function of resonator length $l_b$. The plots delineated by solid lines (i.e., 502, 504 and 506) show resonant frequency as a function of resonator length for "zero-stress" resonators 404. Each of such plots is based on a different resonator thickness. In particular, plots 502, 504 and 506 are based on resonator thicknesses of 0.2, 0.5 and 1 micron, respectively. The plots delineated by dashed lines (i.e., 512, 514, 516 and 518) show resonant frequency as function of resonator length for a "stressed" resonator 404. In particular, plots 512, 514, 516 and 518 are based on stress levels of 1, 10, 100 and 1000 megapascals (MPa), respectively.

When the two restoring forces (i.e., stress and bending moment) are comparable, the resonant frequency is a geometric average given by: $f = (f^2_{stress} + f^2_{bending})^{1/2}$ FIG. 5 shows that to design resonator 404 for a resonant frequency greater than about 100 MHz, resonator length $l_b$ must be less than about 10 microns when the restoring force is dominated by the bending moment contribution (i.e., plots 502–506). In other words, even for stresses as high as 1 GPa, the stress contribution to the restoring force significantly affects the resonant frequency only if the resonator length is greater than about 10 microns. FIG. 5 also shows that for resonant frequencies approaching 1 GHz, beam thickness $t_b$ is a sizable fraction of the beam length $l_b$.

For steady-state current, the mid-point deflection of resonator 404 is given by:

$$u_{mp} = \frac{\lambda}{32Ew_b} \cdot (l_b^4/t_b^3) \quad [13]$$

where:

$\lambda = IB$ = the force per unit length of the resonator.

When input signal 226 oscillates at the resonant frequency, resonator response is enhanced by a factor of Q. The alternating current necessary to generate a given relative displacement $\alpha_b$ at resonance is:

$$I = \frac{32\alpha_b E}{QB} \cdot \frac{w_b t_b^3}{l_b^2} \quad [14]$$

Expression [6] gives the voltage V induced by the motion of the detection circuit in the magnetic field. Evaluation of the integral in expression [6] is more complicated for resonator 404 than resonator 204. The complication arises because, unlike resonator 204 wherein "active" portion 214 of the drive/detection circuit moves uniformly (i.e., simply up and down) through the magnetic field, detection circuit 412 disposed on resonator 404 moves in accordance with the shape of the particular mode (a wave travels through resonator 404), which shape is depicted for the first, second and third resonance modes in FIGS. 6a, 6b, and 6c as plots 602, 604 and 606, respectively, For the first mode, the induced voltage is given by:

$$V = 3.287 l_b f B u_{mp} \quad [15]$$

Even resonance modes can not be detected in filter 400 due to the antisymmetric shape of such modes.

A "pick-up" voltage is generated from the mutual inductance between the drive and detection circuits. The inductance between those circuits is given by:

$$L_{ab} = \frac{\mu_o}{4\pi} \oint_a \oint_b \frac{\vec{dl}_a \cdot \vec{dl}_b}{r} \quad [16]$$

where:

$\mu_o$ is the permeability of free space;

r is the distance between segments $dl_a$ and $dl_b$; and the subscripts "a" and "b" refer to the drive and detection circuits, respectively.

Figure 7:
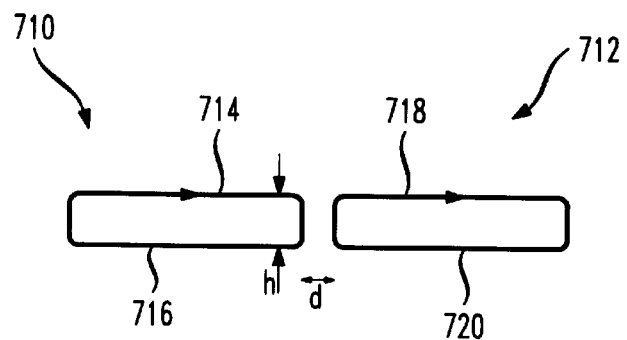
FIG. 7 depicts rectangularly-shaped circuits for modeling the drive and detection circuits of the illustrative filter of FIG. 4.
Figure 8:
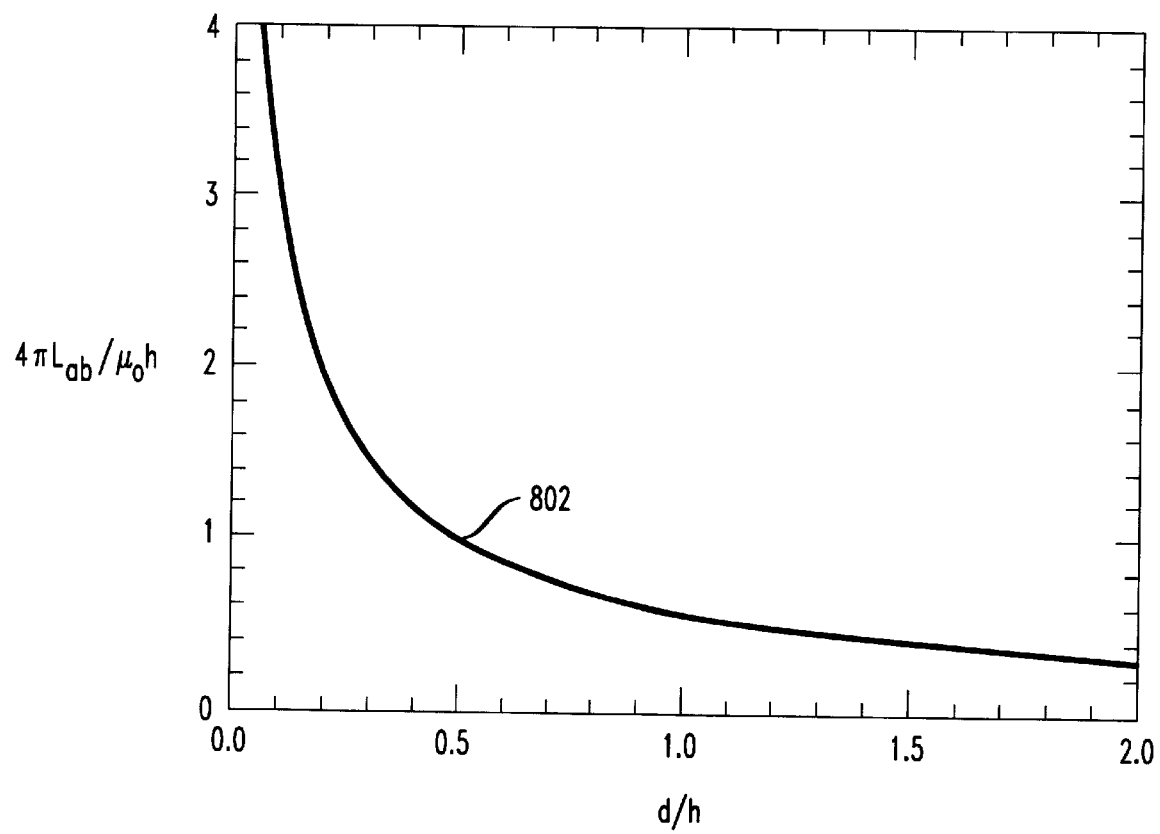
FIG. 8 depicts a plot of a dimensionless function used for calculating inductance between the model circuits of FIG. 7.

Drive and detection circuits 210, 212 may be modeled as in-plane, rectangulary-shaped circuits 710, 712 depicted in FIG. 7. For such circuits, expression [16] implies:

$$L_{ab} = \left(\frac{\mu_o}{4\pi}\right) h \cdot \zeta\left(\frac{d}{h}\right) \quad [17]$$

where d is the distance between circuits 710, 712;

h is the distance between conductors 714 and 716 (or 718 and 720) within a circuit; and $\zeta$ is a dimensionless function evaluated numerically in FIG. 8 and given by plot 802.

Assuming that $d=w_c=l_b/2$ and $h=l_b$, then $d/h=0.5$ and FIG. 8 yields:

$$L_{ab} = \left(\frac{\mu_o}{4\pi}\right)l_b = 0.1l_b \quad [18]$$

where: $L_{ab}$ is the inductance (in <picoHenries> if $l_b$ is in units of microns).

The pick-up voltage $V_p$ due to inductive coupling between the drive and detection circuits is given by:

$$V_p = -L_{ab}\frac{dI}{dt} \quad [19]$$

and, futher, $$V_p = 2\pi f I L_{ab} = 6.28 \times 10^{-4} f I l_b \quad [20]$$

Increasing width $w_b$ of resonator 404 in order to increase separation d between the drive and detection circuits does not reduce pick-up voltage $V_p$. The reason for this is that drive current I would have to be increased by approximately the same factor (as the width) to provide the same deflection in the resonator.

The foregoing expressions will allow a skilled practioner to make a filter incorporating resonator 404 and having characteristics desired for a particular application. Such expressions are applied below in several illustrative examples. For the following examples, it is assumed that resonator 404 is comprised of silicon nitride; resonator width $w_c$ is equal to 0.5×(resonator length $l_b$); resonator thickness $t_b$ equals 0.5 microns; relative displacement $\alpha_b$ equals 0.01; magnetic field strength B equals 2 tesla; the quality factor Q equals $10^5$ and the resonator is under zero stress.

Substituting the values provided above into expressions [11], [15] and [14] yields, for illustrative filter 400::

$$f = 2040 \eta_n^2 t_b/l_b^2 \quad [21]$$

$$V = 0.0657 l_b^2 f \quad [22]$$

$$I = 3.08 \times 10^5 t_b^3/l_b^2 \quad [23]$$

As before, it should be understood that expressions [21]–[23] are not general; they are based on the aforementioned assumptons and the particular units (previously listed) choosen for expressing length, frequency, voltage and amperage.

The ratio of pick-up voltage $V_p$ to induced voltage V is obtained by combining expressions [11], [12], [21] and [23]. Substituting the assumed values into the resulting expression gives:

$$\frac{V_p}{V} = 2.40 \times 10^{-6} \cdot t_b^{1.5} \cdot f^{1.5} \quad [24]$$

where: $t_b$ is measured in microns and frequency is measured in MHz.

Expressions [21]–[24] are used to generate design parameters for illustrative examples of filter 400, where length $l_c$ of resonator 404 is varied from 1 to 20 micron. Such parameters are tabulated in TABLE II, below.

TABLE II

| $l_b$ <μm> | f <MHz> | V <μV> | I <mA> | $V_p$ <μV> | $V_p/V$ |
|---|---|---|---|---|---|
| 1 | 5705 | 374 | 38.5 | 138 | 0.369 |
| 2 | 1426 | 374 | 9.6 | 17 | 0.046 |
| 3 | 634 | 374 | 4.28 | 5.1 | 0.014 |
| 4 | 357 | 374 | 2.41 | 2.2 | 0.006 |
| 5 | 228 | 374 | 1.54 | 1.1 | 0.003 |
| 10 | 57 | 374 | 0.38 | 0.14 | 0.000 |
| 20 | 14 | 374 | 0.10 | 0.02 | 0.000 |

Figure 9:
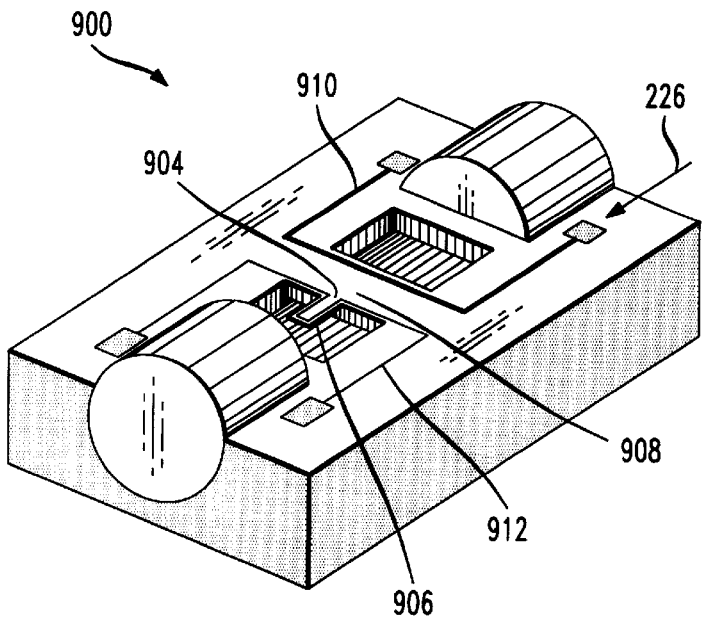
FIG. 9 depicts a micro-machined filter in accordance with a third illustrative embodiment.

FIG. 9 depicts filter 900 in accordance with a third illustrative embodiment of the present invention. In filter 900, resonator 904 is a "hybrid" of resonator 204 and resonators 404 that advantageously combines the cantilever and beam configurations of those resonators. Specifically, resonator 904 includes cantilevered portion 906 and beam portion 908. The aforementioned combination imparts the advantages associated with each configuration to hybrid resonator 904. For example, among any other advantages, resonator 904 can, like cantilever-configured resonator 204, excite the fundamental and higher order resonance modes while the beam-configured resonator 404 typically excites only the fundamental resonance mode. Moreover, neither resonator 904 or resonator 204 experience intrinsic stress that affects the resonant frequency of beam-confined resonator 404. Also, while resonator 404 causes potentially significant non-linear effects that are associated with resonator stretching (even for relatively small beam displacements), neither resonator 904 or resonator 204 cause such non-liner effects. And, unlike resonator 204, but like resonator 404, resonator 904 advantageously retains the ability to have physically-separated drive and detection circuits, such as drive circuit 910 and detection circuit 912.

Filter 900 functions in a manner similar to filters 200 and 400. The Lorentz force generated by the presence of input signal 226 in a magnetic field causes beam portion 908 of resonator 904 to move. Unlike filters 200 and 400, cantilevered portion 906 of resonator 904 is excited to motion by the physical motion of beam portion 908. The beam portion is driven at a frequency below its fundamental frequency. When the frequency of input signal 226 is about equal to the resonant frequency of cantilevered portion 906, the cantilevered portion resonates. A voltage is induced in detection circuit 912 as a result of the motion of the portion of the detection circuit disposed on cantilevered portion 906.

Figure 10:
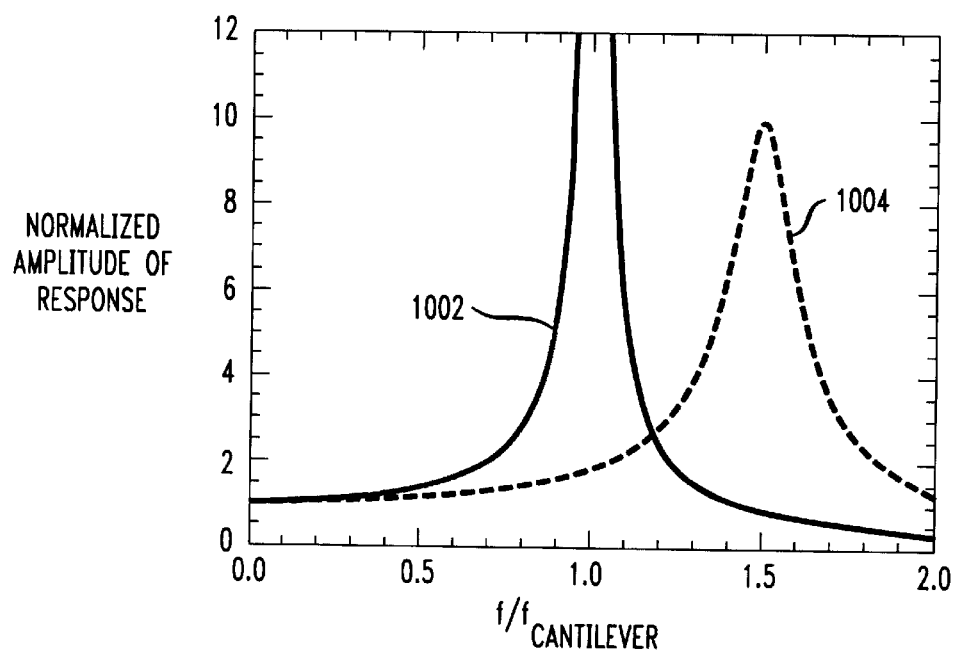
FIG. 10 shows plots depicting the amplitude of response for a cantilevered portion and a beam portion of a hybrid resonator of the illustrative filter of FIG. 9.

FIG. 10 shows plots 1002 and 1004 depicting, respectively, the amplitude of response for the cantilevered portion and the beam portion assuming: (i) that the resonant frequency of beam portion 808 is 50 percent greater than the resonant frequency of cantilevered portion 906, and (ii) that the quality factor $Q_b$ of beam portion 908 is 10, and the quality factor $Q_c$ of cantilevered portion 906 is $10^5$. Selecting a low Q value for beam portion 908 ensures that only a very small induced voltage is generated in detection circuit 912 at the resonant frequency of beam portion. FIG. 10 shows that when driven at the resonant frequency of cantilevered portion 906, beam portion 908 exhibits an inconsequentially small response that is about the same as its zero-frequency response.

Assuming that the modes of oscillation of cantilevered portion 906 and beam portion 908 are substantially independent, the amplitude of cantilevered portion 906 is a factor $Q_c$ larger than the amplitude of beam portion 908 when the beam portion is driven at the resonant frequency of the cantilevered-portion. That is:

$u_{end}=Q_c u_{mp}$ [25]

The current I passing through drive conductor 910 on beam portion 908 that is required to produce a relative displacement $\alpha_c$ of cantilever portion 906 at resonance is given (from expressions [13], [25] and $\lambda$=IB=the force per unit length of resonator) by:

$$I = \frac{32 E_b w_b t_b^3}{B l_b^4} \cdot \frac{\alpha_c l_c}{Q_c} \quad [26]$$

where subscript "b" refers to beam portion 908 and subscript "c" refers to cantilevered portion 906.

Illustrative design parameters for filter 900 are tabulated in TABLE III. The values tabulated in TABLE III are for an embodiment wherein both the beam portion and the cantilevered portion are formed from silicon nitride; both the beam and cantilevered portions have a thickness of 0.2 microns; relative displacement $\alpha_c$ of the cantilevered portion equals 0.01; magnetic field strength B equals 2 tesla; and the quality factor $Q_c$ of the cantilevered portion equals $10^5$ and the quality factor $Q_b$ of the beam portion equals 10. Length $l_b$ of beam portion 908 is set so that the resonant frequency $f_b$ of the beam portion is 10 percent larger than the resonant frequency $f_c$ of the cantilevered portion, and width $w_b$ of the beam portion is equal to one-half of length $l_b$ of the beam portion. Beam portion 908 is assumed to be under zero stress.

TABLE III

| $l_c$ <$\mu$m> | $f_c$ <MHz> | $V_c$ <$\mu$V> | $l_b$ <$\mu$m> | $f_b$ <MHz> | $m_c/m_{total}$ | $I_b$ <$\mu$A> | $V_p$ <$\mu$V> | $V_p/V_c$ |
|---|---|---|---|---|---|---|---|---|
| 1 | 358 | 22.6 | 2.4 | 395 | 0.25 | 176 | 0.095 | 0.004 |
| 2 | 90 | 22.6 | 4.8 | 100 | 0.25 | 44 | 0.012 | 0.001 |
| 3 | 40 | 22.6 | 7.2 | 44 | 0.25 | 20 | 0.005 | 0.000 |
| 4 | 22 | 22.6 | 9.6 | 25 | 0.25 | 11 | 0.002 | 0.000 |
| 5 | 14 | 22.6 | 12.1 | 16 | 0.25 | 7 | 0.001 | 0.000 |
| 10 | 3.6 | 22.6 | 24.1 | 4 | 0.25 | 1.8 | 0.000 | 0.000 |
| 20 | 0.90 | 22.6 | 48.2 | 1 | 0.25 | 0.4 | 0.000 | 0.000 |
| 50 | 0.14 | 22.6 | 120.5 | 0.15 | 0.25 | 0.07 | 0.000 | 0.000 |

Mass $m_c$ of cantilevered portion 906 is not small compared to the mass of beam portion 908 (see TABLE III: $m_c/m_{total}$=0.25). The modes of oscillation of the beam and cantilevered portions are therefore coupled, contrary to the earlier assumption that they were not coupled. In embodiments in which it is desirable to excite higher-order resonance modes of the cantilever, beam length $l_b$ must be further shortened. As a result, mass ratio $m_c/m_{total}$ disadvantageously increases. This problem can be addressed by reducing width $w_c$ of cantilevered portion 906, or by increasing thickness $t_b$ of the beam portion.

In some embodiments, resonator 904 is compared of at least two different materials (e.g., polysilicon and silicon nitride). Using at least two different materials may advantageously simplify manufacture of resonator 904 (facilitate selective etching, etc.). Moreover, it may be problematic to manufacture a silicon nitride beam to a thickness greater than a few tenths of a micron. If a beam portion 906 thicker than a few tenths of a micron is required, and use of silicon nitride is desired, a second material, such as, for example, polysilicon, can be used in conjunction with the silicon nitride to provide the required thickness.

The mechanical behavior of such a composite beam portion can be estimated using average density and average Young's modulus:

$$\bar{\rho} = (t_1/t) \cdot \rho_1 + (t_2/t) \cdot \rho_2 \quad [27]$$

$$\bar{E} = (t_1/t) \cdot E_1 + (t_2/t) \cdot E_2 \quad [28]$$

where:

$t = t_1 + t_2$, and the numeral subscripts "1" and "2" refer to respective first and second materials comprising the beam portion.

In an illustrative embodiment, it is assumed that beam portion 908 is comprised of a 0.2 micron thick layer of silicon nitride disposed on a 0.8 micron layer of silicon. For silicon: E=131 GPa and $\rho$=2.33 gm/cm$^3$, and for silicon nitride: E=385 GPa and $\rho$=3.1 gm/cm$^3$. Substituting those values into expressions [27] and [28] gives:

$$\bar{\rho} = 2.48 \text{ gm/cm}^3 \quad [29]$$

$$\bar{E} = 182 \text{ Gpa} \quad [30]$$

Design parameters for illustrative examples of filter 900 having the aforedescribed dual-material beam portion (but otherwise based on the same underlying assumptions as TABLE III) are tabulated in TABLE IV, below.

TABLE IV

| $l_c$ <$\mu$m> | $f_{1,c}$ <MHz> | $f_{2,c}$ <MHz> | $f_{3,c}$ <MHz> | $V_c$ <$\mu$V> | $l_b$ <$\mu$m> | $f_{3,b}$ <MHz> | $m_c/m_{total}$ | $I_b$ <mA> | $V_p/V_c$ |
|---|---|---|---|---|---|---|---|---|---|
| 1 | 358 | | | 23 | 4.7 | 395 | 0.023 | 1.40 | 0.066 |
| 1 | | 2247 | | 283 | 1.9 | 2470 | 0.125 | 21.20 | 0.201 |
| 2 | 90 | | | 23 | 9.4 | 100 | 0.023 | 0.35 | 0.008 |
| 2 | | 561 | | 283 | 3.8 | 620 | 0.125 | 5.30 | 0.025 |
| 2 | | | 1573 | 793 | 2.3 | 1730 | 0.280 | 23.90 | 0.069 |
| 3 | 40 | | | 23 | 14.1 | 44 | 0.023 | 0.16 | 0.003 |
| 3 | | 250 | | 283 | 5.7 | 275 | 0.125 | 2.41 | 0.008 |
| 3 | | | 699 | 793 | 3.4 | 770 | 0.280 | 11.10 | 0.021 |
| 4 | 22 | | | 23 | 18.8 | 25 | 0.023 | 0.09 | 0.001 |
| 4 | | 141 | | 283 | 7.5 | 155 | 0.125 | 1.38 | 0.003 |
| 4 | | | 393 | 793 | 4.5 | 432 | 0.280 | 6.39 | 0.009 |
| 5 | 14 | | | 23 | 23.4 | 16 | 0.023 | 0.06 | 0.001 |
| 5 | | 90 | | 283 | 9.4 | 100 | 0.125 | 0.88 | 0.002 |
| 5 | | | 252 | 793 | 5.6 | 280 | 0.280 | 4.15 | 0.005 |
| 10 | 3.6 | | | 23 | 46.9 | 4 | 0.023 | 0.01 | 0.000 |
| 20 | 0.90 | | | 23 | 93.8 | 1 | 0.023 | 0.0035 | 0.000 |
| 50 | 0.14 | | | 23 | 242.2 | 0.15 | 0.023 | 0.0005 | 0.000 |

Further description of the design of a filter in accordance with the illustrative embodiments of the present invention is provided below. As an illustrative example, consider a 250

MHz filter having a resonator with a cantilevered portion that is 3 microns in length and a beam portion that is 5.7 microns in length (see TABLE IV).

To obtain a magnetic field strength near the saturation value of the magnetic material used, the gap between the two magnets 220a, 220b (or the gap between opposed of a single magnet) must be small compared to magnet diameter. For the present illustrative example, length $l_c$ of the cantilevered portion and width $w_b$ of the beam portion total about 6 microns (3+0.5×5.7). As such, a spacing between magnets 220a and 220b of about 50 microns provides sufficient room for the resonator. Moreover, magnet length must be large compared to magnet diameter. It is expected that a magnet having a diameter equal to about five times the gap spacing between the magnets (or magnet ends) is suitable for obtaining the desired magnetic field strength. For the illustrative example, magnet diameter is therefore 250 microns. Choosing a length to width aspect ratio of about ten, magnet length is then 2.5 mm. Filter size and field emissions are reduced when the filter comprises a single magnet that is bent into a "C" or substantially circular shape.

Figure 11:
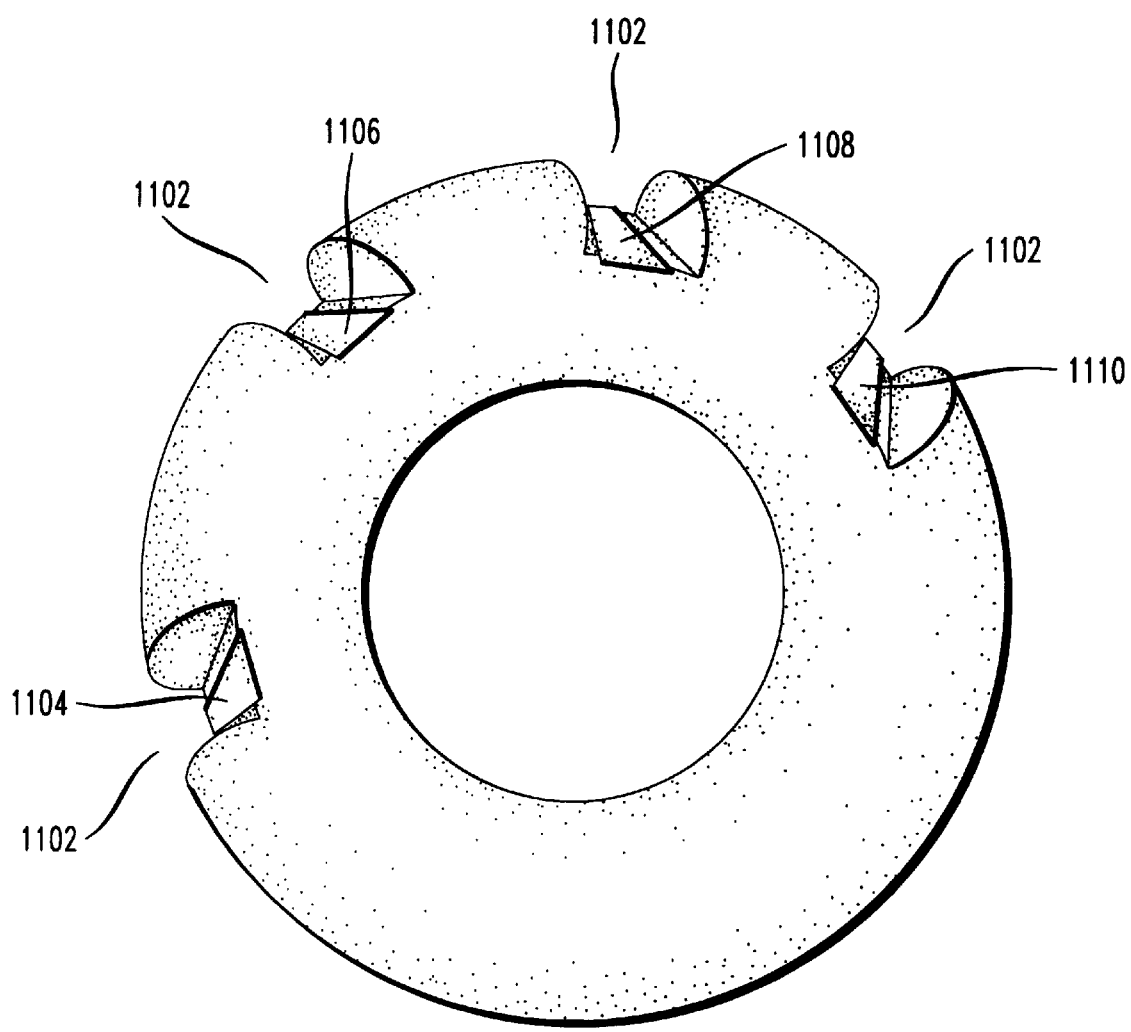
FIG. 11 shows a magnet having multiple slots for receiving multiple filters in accordance with an illustrative embodiment of the present invention.

In an additional embodiment depicted in FIG. 11, slots 1102 can be provided within a single circularly-configured magnet such that a plurality of filters, four of which are shown in the Figure (filters 1104, 1106, 1108 and 1110), can be used in conjunction with a single magnet.

It will be appreciated, moreover, that while the present specification describes the in which the present filters may be used in radio, the radio is not the only application for such filters. For example, in other embodiments, the present filters are used to make improved wireless terminals, amplifers and to improve other elements of wireless telecommunications systems. In still further embodiments, the present filters are used in conjunction with other non-telecommunications-related circuits and devices. The enormous number of applications for the present filters defy listing; those skilled in the art will be able to readily identify many applications for the present filters, and how to improve devices and circuits by designing filters for them in accordance with to the present teachings.

It is to be understood that the embodiments described herein are merely illustrative of the many possible specific arrangements that can be devised in application of the principles of the invention. Other arrangements can be devised in accordance with these principles by those of ordinary skill in the art without departing form the scope and spirit of the invention. For example, in some of the illustrative embodiments described herein, at least a portion of the drive and detection conductors were shown/described to be disposed in orthogonal relation to the magnetic field lines. Such an orientation maximizes the resulting Lorentz force and the induced voltage. It should be appreciate, however, that such a force can be generated and such a voltage can be induced as long as the conductors are not parallel to the magnetic field. It is therefore intended that such other arrangements be included within the scope of the following claims and their equivalents.

I claim:

1. An article for frequency discrimination operable to receive a first signal having a first bandwidth including a desired frequency, and further operable to deliver a second signal having a second bandwidth including the desired frequency, wherein the second bandwidth is narrower than the first bandwidth, comprising:

a magnetic field;

a movable member, at least a first portion of which resonates at the desired frequency;

a drive circuit that receives the first signal, the drive circuit comprising a drive conductor, at least a portion of which drive conductor is disposed on a surface of the first portion of the movable member and relative to the magnetic field such that a generated force is directed orthogonally to the surface;

a detection circuit comprising a detection conductor, at least a portion of which detection conductor is disposed on the surface of the first portion of the movable member and relative to the magnetic field such that the second signal is induced therein, wherein the generated force moves the movable member, and the second signal is induced in the portion of the detection conductor in response to resonant movement of the first portion of the movable member.

2. The article of claim 1, wherein the first portion of the movable member has a quality factor in the range of about 1000 to about 100,000.

3. The article of claim 1, wherein the movable member comprises silicon nitride.

4. The article of claim 3, wherein the movable member is comprises silicon nitride and silicon.

5. The article of claim 1, wherein the magnetic field is generated by a permanent magnet.

6. The article of claim 1, wherein the movable member, the detection circuit and the drive circuit are disposed on a support with other circuits.

7. The article of claim 6, wherein the other circuits comprise a radio.

8. The article of claim 6, futher comprising a magnet disposed on the support.

9. The article of claim 1, wherein the first portion of the movable member is a cantilever.

10. The article of claim 9, wherein the movable member has a length of about 100 $\mu$m or less.

11. The article of claim 9 wherein the drive circuit and the detection circuit comprise a single circuit.

12. The article of claim 1, wherein the movable member is a beam having two ends, wherein the movable member is fixed at both ends.

13. The article of claim 12, wherein the movable member has a length of about 100 $\mu$m or less.

14. An article for frequency discrimination operable to receive a first signal having a first bandwidth including a desired frequency, and further operable to deliver a second signal having a second bandwidth including the desired frequency, wherein the second bandwidth is narrower than the first bandwidth, comprising:

a magnetic field;

a movable member having a cantilevered portion that resonates at the desired frequency and a beam portion that resonates at a frequency different from the desired frequency, wherein the cantilevered portion depends from the beam portion;

a drive circuit that receives the first signal, the drive circuit comprising a drive conductor, at least a portion of which drive conductor is disposed on a surface of the beam portion and relative to the magnetic field such that a generated force is directed orthogonally to the surface; and a detection circuit comprising a detection conductor, at least a portion of which detection conductor is disposed on a surface of the cantilevered portion and relative to the magnetic field such that the second signal is induced therein.

15. The article of claim 14, wherein the cantilevered portion has a quality factor that is in the range of about 1000 to about 100,000 times greater than a quality factor of the beam portion.

16. The article of claim 14, wherein the beam portion of the movable member has a second length, and the cantilevered portion has a first length, and the second length is longer than the first length.

17. The article of claim 16 wherein the first length is in the range of about 100 microns or less.

18. A radio comprising:

an antenna that receives (i) a first signal comprising a plurality of modulated RF carrier signals having frequencies within first band, and (ii) undesired signals having frequencies outside of the first band;

a first filter having a first pass band substantially equal to the first band, the first filter operable to generate a second signal comprising substantially all the modulated RF carrier signals and substantially none of the undesired signals;

an amplifier that amplifies the second signal;

a tunable downconverter that receives the amplified second signal and generates a third signal by reducing the frequencies of the modulated RF carrier signals comprising the second signal such that a selected one of the down-converted modulated RF carrier signals has a desired down-converted frequency;

a second filter having a second pass band, wherein the desired down-converted frequency is within the second pass band, the second filter comprising:

a first magnetic field;

a first movable member, at least a first portion of which resonates at a center frequency of the second pass band;

a first drive circuit that receives the third signal, the first drive circuit comprising a drive conductor, at least a portion of which drive conductor is disposed on a surface of the first portion of the first movable member and relative to the first magnetic field such that a generated force is directed orthogonally to the surface;

a first detection circuit comprising a detection conductor, at least a portion of which detection conductor is disposed on a surface of the first portion of the first movable member and relative to first magnetic field such that a voltage is induced therein; wherein a fourth signal comprising a signal having the down-converted frequency and substantially no other down-converted modulated RF carrier-signal frequencies is induced in the portion of the detection conductor in response to resonant movement of the first portion of the first movable member; and a demodulator for demodulating the one selected down-converted modulated RF carrier signal.

19. A radio comprising:

an antenna that receives (i) a first signal comprising a plurality of modulated RF carrier signals having frequencies within a first band, and (ii) undesired signals having frequencies outside of the first band;

a first filter having a first pass band substantially equal to the first band, the first filter operable to generate a second signal comprising substantially all the modulated RF carrier signals and substantially none of the undesired signals;

an amplifier that amplifies the second signal;

a tunable downconverter that receives the amplified second signal and generates a third signal by reducing the frequencies of the modulated RF carrier signals comprising the second signal such that a selected one of the down-converted modulated RF carrier signals has a desired down-converted frequency;

a second filter having a second pass band, wherein the desired down-converted frequency is within the second pass band, the second filter comprising:

a first magnetic field;

a first movable member having a cantilevered portion that resonates at a center frequency of the second pass band and a beam portion that resonates at a frequency different from said center frequency, wherein the cantilevered portion depends from the beam portion;

a first drive that receives the third signal, the first drive circuit comprising a drive conductor, at least a portion of which drive conductor is disposed on a surface of the beam portion and relative to the first magnetic field such that a generated force is directed orthogonally to the surface;

a first detection circuit comprising a detection conductor, at least a portion of which detection conductor is disposed on a surface of the first portion of the cantilevered portion and relative to the first magnetic field such that a voltage is induced therein; wherein, a fourth signal comprising a signal having the down-converted frequency and substantially no other down-converted modulated RF carrier-signal frequencies is induced in the portion of the detection conductor in response to resonant movement of the cantilevered portion of the first movable member; and a demodulator for demodulating the one selected down-converted modulated RF carrier signal.

20. The radio of claim 18, wherein the antenna, the first filter, the low-noise amplifier, the tunable downconverter, the second filter and the demodulator are all disposed on a single support.

* * * * *